US006462338B1

(12) United States Patent
Inatsugu et al.

(10) Patent No.: US 6,462,338 B1

(45) Date of Patent: Oct. 8, 2002

(54) MASS SPECTROMETER

(75) Inventors: Norihito Inatsugu; Hiroaki Waki, both of Kyoto (JP)

(73) Assignee: Shimadzu Corporation, Kyoto (JP)

(*) Notice: Subject to any disclaimer, the term of this patent is extended or adjusted under 35 U.S.C. 154(b) by 0 days.

(21) Appl. No.: 09/386,151

(22) Filed: Aug. 31, 1999

(30) Foreign Application Priority Data

Sep. 2, 1998 (JP) .......................................... 10-248310

(51) Int. Cl.[7] .......................... H01J 49/42; H01J 37/12

(52) U.S. Cl. .................................. 250/292; 250/396 R

(58) Field of Search ............................. 250/292, 396 R

(56) References Cited

U.S. PATENT DOCUMENTS 3,410,997 A * 11/1968 Brubaker .................... 250/290
5,811,800 A * 9/1998 Franzen et al. ............. 250/292
5,847,386 A * 12/1998 Thomson et al. ........... 250/288

FOREIGN PATENT DOCUMENTS

| | | |
|---|---|---|
| EP | 0237259 A2 * | 9/1987 |
| EP | 0813228 | 12/1997 |
| GB | 1041481 | 9/1966 |
| GB | 2178893 | 2/1987 |
| WO | 97/49111 | 12/1997 |

* cited by examiner

*Primary Examiner*—Jack Berman

(74) *Attorney, Agent, or Firm*—Armstrong, Westerman & Hattori, LLP

(57) ABSTRACT

A mass spectrometer according to the present invention includes an ion lens composed of an even number of virtual rod electrodes 31, 32 positioned separately around the ion beam axis C, where each of the virtual rod electrodes is composed of a plurality of separate metallic plate electrodes aligned in a row. For example, the virtual rod electrode 32 consists of five lens electrodes 321–325 aligned in a row parallel to the ion beam axis C. A voltage composed of a DC voltage and a high frequency AC voltage superimposed thereon is applied to each of the plate electrodes 321–325, where the DC voltage is changed according to the position of the plate electrode while the high frequency AC voltage is the same irrespective of the position. Ions travelling through the ion lens oscillates transversally due to the electric field generated by the high frequency AC voltage and converge on the focal point F of the ion lens. There, the ions gain kinetic energy from the potential gradient due to the DC voltages, whereby the ions are accelerated. Thus, the ions keep travelling without being displaced too much from due converging paths even when they collide with molecules of residing gas, and enter the section behind the ion lens through the orifice of the skimmer 16. Thus, the convergence and acceleration of ions are effectively performed even when the pressure in the first interface chamber 12 is as high as near atmospheric pressure.

10 Claims, 6 Drawing Sheets

VOLTAGE APPLIED TO
QUADRUPOLE FILTER

MASS NUMBER OF
IONS TO BE ANALYZED

DC VOLTAGE APPLIED TO
LENS ELECTRODE

HIGH FREQUENCY AC
VOLTAGE APPLIED TO
LENS ELECTRODE
(EFFECTIVE VALUE)

MASS SPECTROMETER

The present invention relates to a mass spectrometer having an ionization chamber in which a sample is ionized under a pressure as high as near atmospheric pressure. Mass spectrometers of this type include, for example, an Inductively Coupled Plasma Mass Spectrometer (ICP-MS), an ElectroSpray Ionization Mass Spectrometer (ESI-MS), an Atmospheric Pressure Chemical Ionization Mass Spectrometer (APCI-MS).

BACKGROUND OF THE INVENTION

FIG. 7 schematically shows the construction of a conventional electrospray ionization mass spectrometer. The mass spectrometer includes an ionization chamber 10 provided with a nozzle 11 connected to, for example, the outlet of a column of a liquid chromatograph, and an analyzing chamber 18 in which a quadrupole filter 19 and an ion detector 20 are accommodated. A wall separates the space between the two chambers 10, 18 into two parts, which are referred to as the first and second interface chambers 12, 15. The ionization chamber 10 and the first interface chamber 12 communicate only through a heated capillary 13, which is a pipe of a small inner diameter. The first interface chamber 12 and the second interface chamber 15 communicate only via skimmer 16 having an orifice 16 of a very small diameter.

The pressure in the ionization chamber 10 is maintained at about the atmospheric pressure by a continuous supply of a sample gas from the nozzle 11. The first interface chamber 12 is evacuated with a rotary pump (RP) so that the inside is kept at a low vacuum of about $10^2$ Pa. The second interface chamber 15 is evacuated with a turbo molecular pump (TMP) so that the inside is kept at a middle-vacuum of about $10^{-1}$ to $10^{-2}$ Pa, and the analyzing chamber 18 is evacuated with another turbo molecular pump (or the same TMP mentioned above) so that the inside is kept at a high-vacuum of about $10^{-3}$ to $10^{-4}$ Pa. Thus, the analyzing chamber 18 is maintained at the high vacuum by decreasing the pressure gradually from the ionization chamber 10 to the analyzing chamber 18.

In an electrospray method, sample liquid is sprayed from the nozzle 11 into the ionization chamber 10 and the sample molecules are ionized when the solvent contained in the fine liquid particles vaporizes. The mixture of the liquid particles and the ions are drawn into the capillary 13 due to the pressure difference between the ionization chamber 10 and the first interface chamber 12, where the ionization further proceeds when the mixture flows through the capillary 13. The first interface chamber 12 is provided with a ring electrode 14 inside, which generates an electric field for assisting the drawing-in of ions to the capillary 13 for converging ions to the orifice of the skimmer 16.

The ions introduced through the orifice of the skimmer 16 into the second interface chamber 15 are converged and accelerated by an ion lens 17, and enters the analyzing chamber 18. In the analyzing chamber 18, only ions of a particular mass number (i.e. ratio of mass (m) 10 to charge (z), m/z) pass through the longitudinal space around the central axis of the quadrupole filter 19. Ions passing through the quadrupole filter 19 are detected by the ion detector 20.

The ion lens 17 in the second interface chamber 15 generates an electric field to accelerate and converge travelling ions as described above, and various types of ion lenses have been proposed conventionally. FIG. 8 is a perspective view of one of such lenses, a so-called electrostatic lens. The ion lens 21 shown in FIG. 8 is composed of plural lens electrodes made of ring metal plates. The lens electrodes are applied the same DC voltage. When the DC voltage is determined appropriately, ions travelling through the ion lens 21 on or near the ion beam axis C are accelerated. The ion lens, however, is deficient in that the converging efficiency is not very high, especially when the pressure is as high as $10^{-1}$ Pa or higher. Accordingly, when, for example, ions travelling through the ion lens disperse, only a part of the ions pass through the ion lens and enter the section behind.

FIG. 9 shows another type of practically used ion lens, a so-called multi-pole type. The ion lens 22 shown in FIG. 9 is composed of four rod electrodes, but the number of rod electrodes may be any number so long as it is even. The rod electrodes are applied the same DC voltage and a high frequency AC voltage superimposed on it, where the phases of the high frequency AC voltages of adjacent rod electrodes are reversed. Electric field generated by the rod electrodes influences the ions introduced along the ion beam axis C so that they oscillate while travelling through the ion lens 22. By this type of ion lens, the converging effect of ions is very high, so that more ions pass through the ion lens and enter the section behind.

This type of ion lens, however, is also deficient in that ions are not accelerated while travelling in the space surrounded by the rod electrodes, since the potential gradient in the longitudinal direction of the space is zero. Therefore, when the ion lens is used under a condition where the pressure is as high as in the first interface chamber 12, only a small number of ions can pass through the ion lens, because the ions lose their kinetic energy as they collide with molecules of gas in the chamber.

With regard to the above-described problem, one object of the present invention is to propose a mass spectrometer having an ion lens whereby the convergence and acceleration of ions are performed effectively even under a pressure as high as near atmospheric pressure.

SUMMARY OF THE INVENTION

Thus, the present invention proposes a mass spectrometer having an ion lens for converging ions, characterized in that the ion lens is composed of an even number of virtual rod electrodes positioned separately around the ion beam axis, where each of the virtual rod electrodes is composed of a plurality of separate metallic plate electrodes aligned in a row, and a voltage is applied to each of the plate electrodes.

In the above-described mass spectrometer, the voltage applied to each of the plate electrodes constituting a virtual rod electrode is determined with respect to the position of the plate electrode in the virtual rod electrode. For example, when a voltage composed of a DC voltage and a high frequency AC voltage superimposed thereon is applied to each of the plate electrodes, the DC voltage may be changed according to the position of the plate electrode while the high frequency AC voltage is set at the same irrespective of the position. The high frequency AC voltage applied to a virtual rod electrode should be reversed in phase against that applied to the adjacent virtual rod electrode.

When ions produced in an ionization chamber enter the ion lens, the ions travelling through the ion lens oscillate transversally due to the electric field generated by the high frequency AC voltage, and converge on a focal point of the ion lens. Meanwhile, the voltage gradient due to the change in the DC voltage applied to the plate electrodes accelerates the ions. Thus, the ions keep travelling without being displaced too much from due converging paths even when they collide with molecules of residing gas. Therefore, when, for example, a skimmer having is set behind the ion lens so that the orifice is positioned at the focal point of the ion lens, a large number of ions can pass through the orifice and enter the section behind it.

Thus, by the mass spectrometer according to the present invention, the convergence and acceleration of ions are effectively performed even when the pressure is as high as near atmospheric pressure. As a result, an adequate amount of ions can enter the mass filter set behind the ion lens, and the sensitiveness and accuracy of the mass spectrometry are improved. Also, according to the present invention, various forms of electric field that are hardly realized by conventional solid electrodes can be realized without difficulty.

When, in the above-described ion lens, an ion has a relatively large kinetic energy, the ion is hard to converge and, accordingly, the probability of the ion's passing through the ion lens is relatively low. Such a characteristic of the ion lens should be considered especially when atmospheric pressure chemical ionization method is used. That is, by atmospheric pressure chemical ionization, speed of ions is accelerated by a jet of nebulizer gas ejected at a constant speed. In this case, the initial kinetic energy of an ion is greater as the mass of the ion is larger. Therefore, the probability of an ion's passing through the ion lens differs depending on the mass, which may yield an error in the result of mass spectrometry.

With regard to the above-described problem, the mass spectrometer according to one aspect of the present invention is constituted so that the voltage applied to a part of the plate electrodes is changed according to the mass number of ions intended to pass through the ion lens. For example, when a combination of a DC voltage and a high frequency AC voltage is applied to each of the plate electrodes, the DC component of the voltage applied to the last one or ones of the plate electrodes nearest to the exit of the ion lens is changed according to the mass number of the ions intended to pass through the ion lens.

In the above-described mass spectrometer, the rate of acceleration of ions travelling through the plate electrodes nearest to the exit of the ion lens can be controlled by changing the DC component of the voltage applied to them. When the mass spectrometer uses a quadrupole filter placed behind the ion lens, the DC component of the voltage applied to the plate electrodes may be preferably scanned synchronous to the scanning of voltage applied to the quadrupole filter. By controlling voltage as described above, the speed of ions having a greater kinetic energy due to a large mass number is relatively reduced, so that the ions are converged to the hole or orifice of the skimmer and enter the section behind.

Since, by the mass spectrometer constituted as described above, the convergence of ions are performed appropriately with respect to the mass number of the ions, an adequate amount of ions enter the section behind, irrespective of the mass number of the ions. Thus the accuracy and reproducibility of analysis is improved.

DETAILED DESCRIPTION OF A PREFERRED EMBODIMENT

[First Embodiment]

Figure 1:
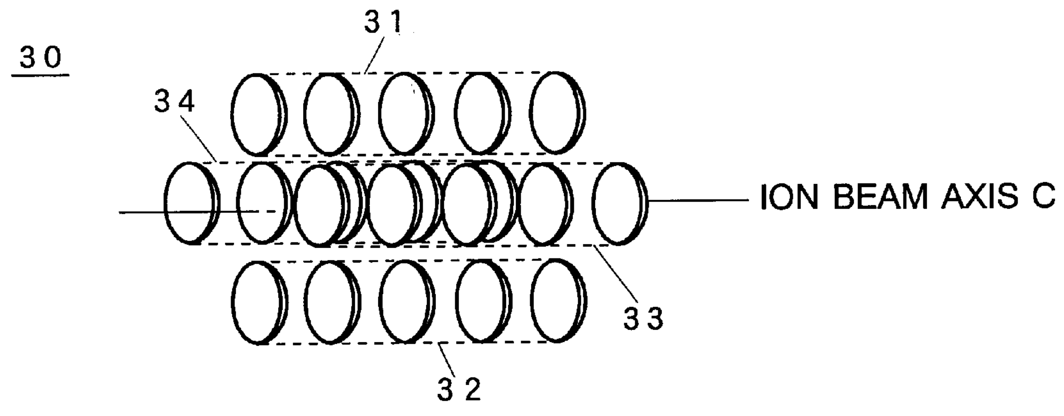
FIG. 1 is a perspective view of an ion lens of a mass spectrometer as a first embodiment of the present invention.
Figure 2:
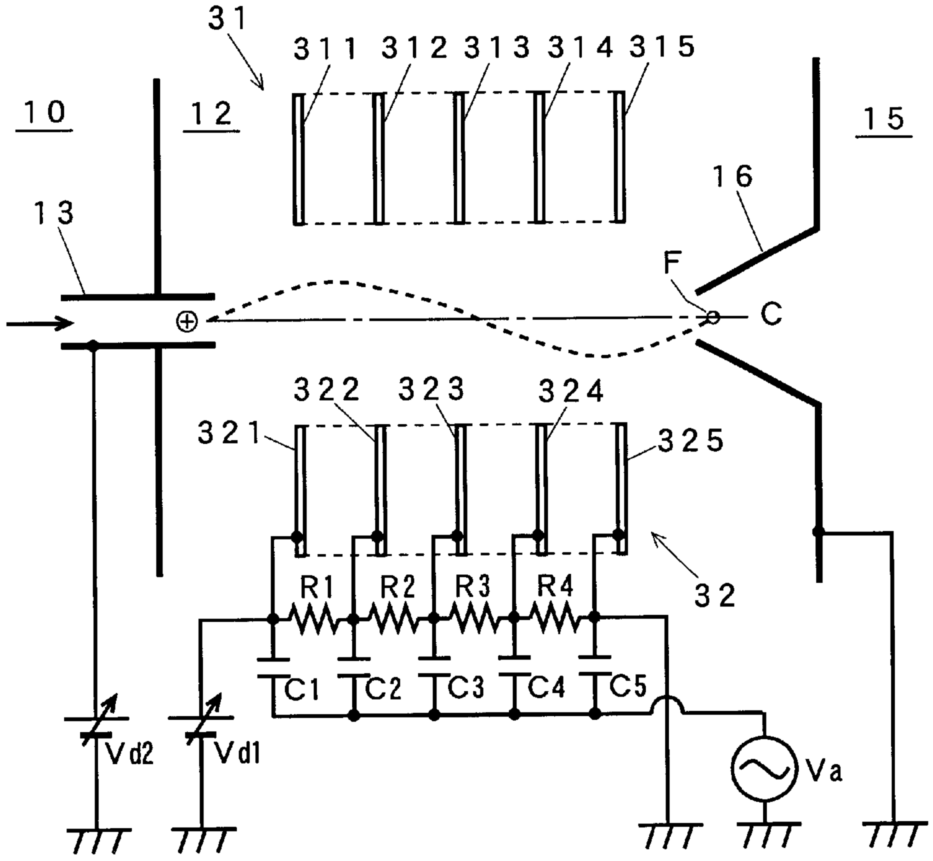
FIG. 2 shows the construction of the ion lens and other parts surrounding it in the mass spectrometer of the first embodiment.
Figure 9:
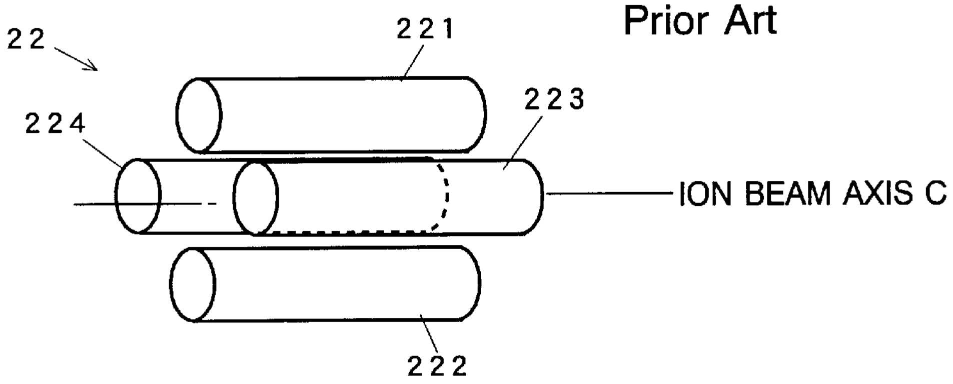
Fig. 9 Prior Art
FIG. 9 is a perspective view of another conventional ion lens.

The first embodiment of the mass spectrometer according to the present invention is described, referring to FIGS. 1 and 2. The mass spectrometer of the first embodiment includes an ion lens 30 composed of a number of metallic disc electrodes of the same diameter. Each disc electrode is hereinafter referred to as a "lens electrode". The lens electrodes are separated into four groups, each consisting of the same number of the lens electrodes aligned in a row at preset intervals parallel to the ion beam axis C. The envelope of the lens electrodes of each group forms a virtual rod, as denoted by numerals 31, 32, 33 and 34 in FIG. 1. In the present specification, the group of the lens electrodes forming a virtual rod is referred to as a "virtual rod electrode". The four virtual rod electrodes 31–34 of the ion lens 30 correspond to the four rod electrodes 221–224 of the conventional ion lens 22 shown in FIG. 9.

Figure 7:
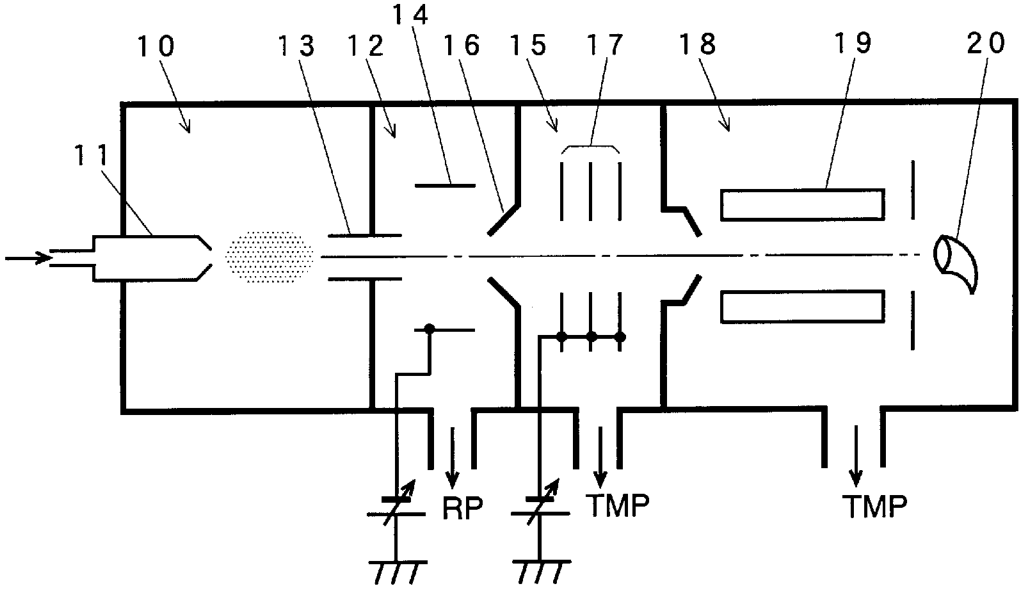
Fig. 7 Prior Art
FIG. 7 shows a schematic construction of a conventional electrospray ionization mass spectrometer.
Figure 8:
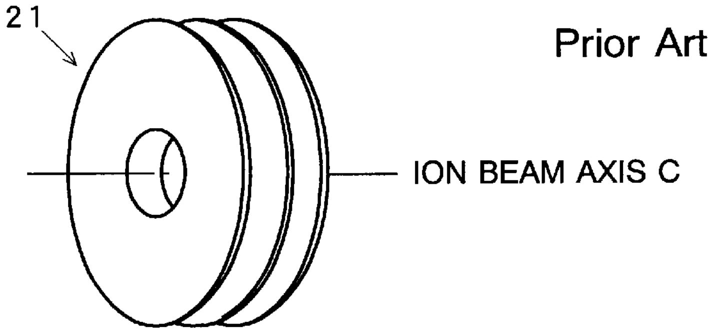
Fig. 8 Prior Art
FIG. 8 is a perspective view of a conventional ion lens.

When the ion lens 30 is applied to a mass spectrometer as shown in FIG. 7, the ion lens 30 is set in the first interface chamber 12 in place of the ion lens 14, as shown in FIG. 2, where only a pair of opposing virtual rod electrodes 31, 32 are shown. In the virtual rod electrode 32, the lens electrodes 321–325 are connected to a voltage unit including a DC voltage source Vd1, a high frequency AC voltage source Va, resistors R1–R4 and capacitors C1–C5. The voltage unit applies to each of the lens electrodes 321–325 a voltage composed of a DC voltage and a high frequency AC voltage superimposed on the DC voltage. The DC voltages applied to the lens electrodes are set to decrease toward the exit of the ion lens 30, while the high frequency AC voltage is set at the same. Though not shown in FIG. 2, the lens electrodes 311–315 are similarly connected to the voltage unit. In the other pair of virtual rod electrodes (33, 34) not shown in FIG. 2, the voltage unit applies to each of the lens electrodes a voltage composed of the same DC voltages as described above and a high frequency AC voltage reversed in phase to that applied to the lens electrodes of the first pair of the virtual rod electrodes 31, 32.

The voltage unit also includes another DC voltage source Vd2 for applying voltage to the capillary 13. The voltage values of the DC voltage sources Vd1, Vd2 and the high frequency AC voltage Va are preset appropriately.

By applying voltages as described above, an electric field composed of two components is generated in the space surrounded by the virtual rod electrodes. The first component is a static field, where the voltage potential gradually decreases from the entrance (lens electrodes 311, 321) to the exit (lens electrode 315, 325), and the second component is an alternating field. While the ions introduced from the ionization chamber 10 through the capillary 13 into the interface chamber 12 travel through the ion lens 30, the ions oscillate due to the alternating field. Meanwhile, the ions gain kinetic energy from the potential gradient of the static field, whereby the ions are accelerated. Thus gaining adequate kinetic energy, the ions keep travelling without being unduly displaced from due converging paths even when they collide with molecules of residing gas, and converge on or in proximity of the focal point F of the ion lens. The skimmer 16 is placed behind the exit of the ion lens 30 so that the orifice is positioned at the focal point. Accordingly, the ions converged to the focal point pass through the orifice and enter the second interface chamber 15.

Thus, by the mass spectrometer of the first embodiment, the ions are effectively converged and accelerated by the ion lens 30 even under a relatively high pressure, so that an adequate number of ions enter the section behind.

[Second Embodiment]

Figure 3A:
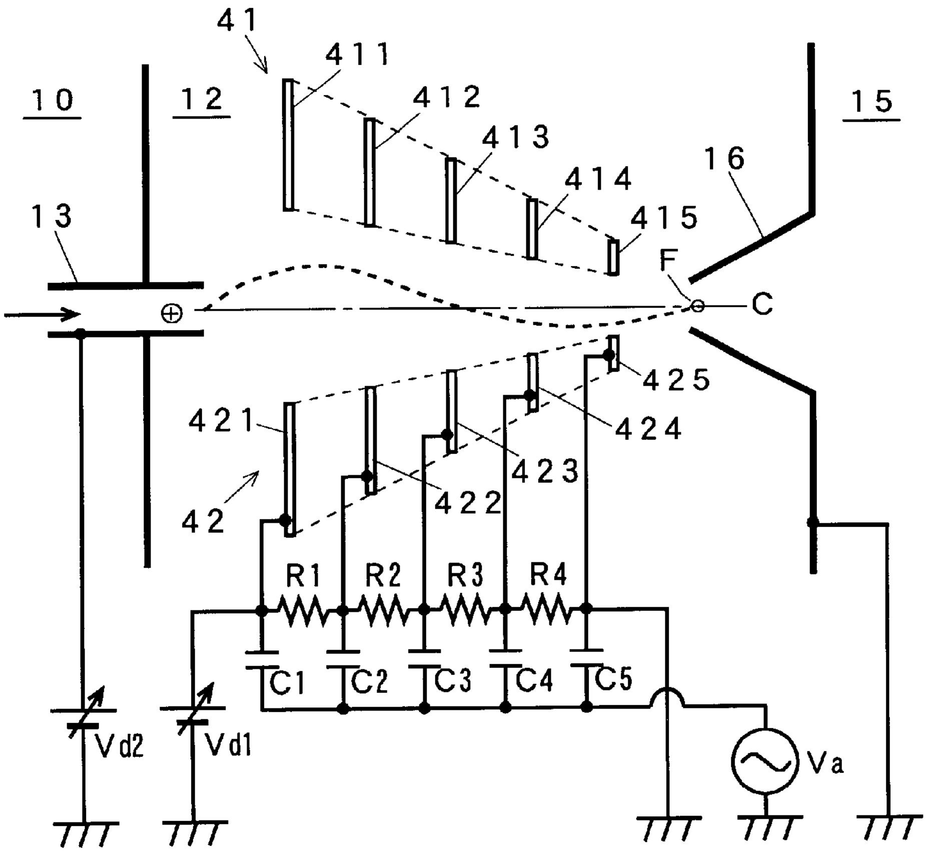
FIG. 3A shows the construction of an ion lens and peripheral parts in a mass spectrometer as a second embodiment of the present invention.
Figure 3B:
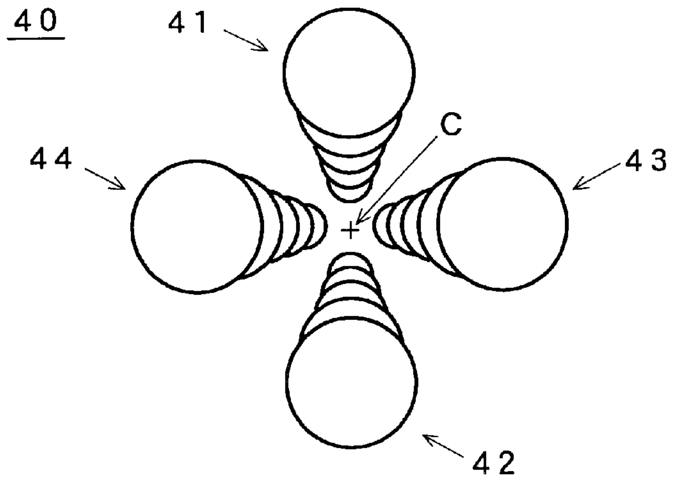
FIG. 3B shows the ion lens of FIG. 3A, viewed from an entrance side of the ion lens.

The second embodiment of the mass spectrometer according to the present invention is described, referring to FIGS. 3A and 3B. The mass spectrometer of the second embodiment is the same as the mass spectrometer of the first embodiment except for the fact that a different ion lens 40 is used in place of the ion lens 30 described above.

The ion lens 40 of the second embodiment is also composed of four virtual rod electrodes 41–44, each consisting of plural separate disc electrodes (or lens electrodes). But in this embodiment, the lens electrodes (411–415, 421–425) in a virtual rod electrode are aligned so that the distance between a lens electrode and the ion beam axis C becomes smaller toward the exit of the ion lens 40. Thus, the space surrounded by the virtual rod electrodes is shaped like a cone. The diameter of each lens electrode is calculated by a predetermined formula with respect to the distance between the lens electrode and the ion beam axis C so that the diameter is smaller as the lens electrode is closer to the exit of the ion lens 40. By such a construction, the performance of converging ions to the focal point F of the ion lens 40 is higher than by the construction as shown in FIG. 2, so that the probability of an ion's passing through the orifice of the skimmer 16 and entering the second interface chamber 15 is higher. When the ion lens uses solid rod electrodes, it is difficult to realize the above-described construction because it requires a sophisticated and precise manufacturing technique. When, on the other hand, plural plate electrodes are used as in the present invention, a desirable construction can be realized with less difficulty.

[Third Embodiment]

Figure 4:
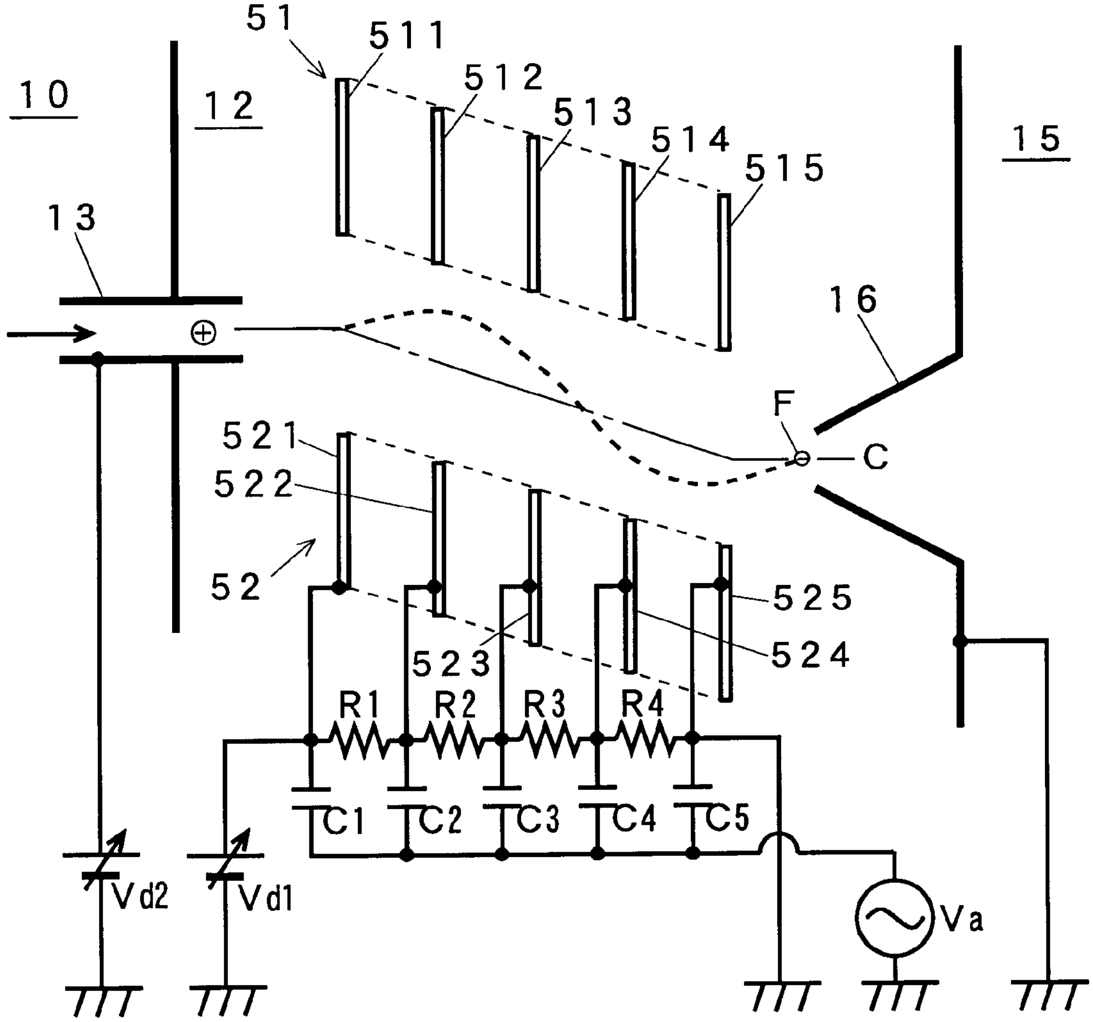
FIG. 4 shows the construction of an ion lens and peripheral parts in a mass spectrometer as a third embodiment of the present invention.

The third embodiment of the mass spectrometer according to the present invention is described referring to FIG. 4. The mass spectrometer of the third embodiment is the same as the mass spectrometer of the first or second embodiment except for the fact that the orifice of the skimmer 16 is offset from the exit axis of the capillary 13 and that a still different ion lens 50 is used in place of the ion lens 30 or 40 described above. The ion lens 50 is also composed of four virtual rod electrodes, each consisting of plural disc electrodes (or lens electrodes), though FIG. 4 shows only two of them denoted by the numerals 51, 52. The lens electrodes (511–515, 521–525) are progressively displaced so that the ion beam axis C runs obliquely from the exit of the capillary 13 to the orifice of the skimmer 16.

The ions introduced through the capillary 13 into the first interface chamber 12 are influenced by the electric field generated by the ion lens 50 so that they converge on the focal point F of the ion lens 50 and pass through the orifice of the skimmer 16. Beside the ions, molecules and atoms that are not ionized in the ionization chamber 10 and the capillary 13 also enter the first interface chamber 12. Such neutral molecules and atoms, however, cannot pass through and enter the second interface chamber 15 because they travel straight without being influenced by the electric field and are blocked by the skimmer 16. By such a construction, the background noise caused by neutral molecules and atoms is removed effectively.

[Fourth Embodiment]

The fourth embodiment of the mass spectrometer according to the present invention is described below. In general, a nebulizer gas is ejected in the same direction as the spraying direction of the ions to assist the ion spray in the ionization chamber of a mass spectrometer as shown in FIG. 7. The ejecting speed of the nebulizer gas is kept constant. Since, as described before, the magnitude of the kinetic energy of an ion depends on the ejecting speed of the nebulizer gas and the mass of the ion, an ion of a larger mass comes into the in lens with a larger kinetic energy. When an ion passing through an ion lens has a larger kinetic energy, the ion is less influenced by the electric field, so that the ion is hard to converge on the focal point F of the ion lens. Therefore, when the voltage is applied to all the lens electrodes in the same manner as described in the first to third embodiments, the probability of an ion's passing through the skimmer is relatively high when the mass number of the ion is small, whereas the probability is low when the mass number is large.

In the mass spectrometer of the fourth embodiment, the difference in the converging efficiency of ions with respect to the mass number is eliminated as described below.

Figure 5:
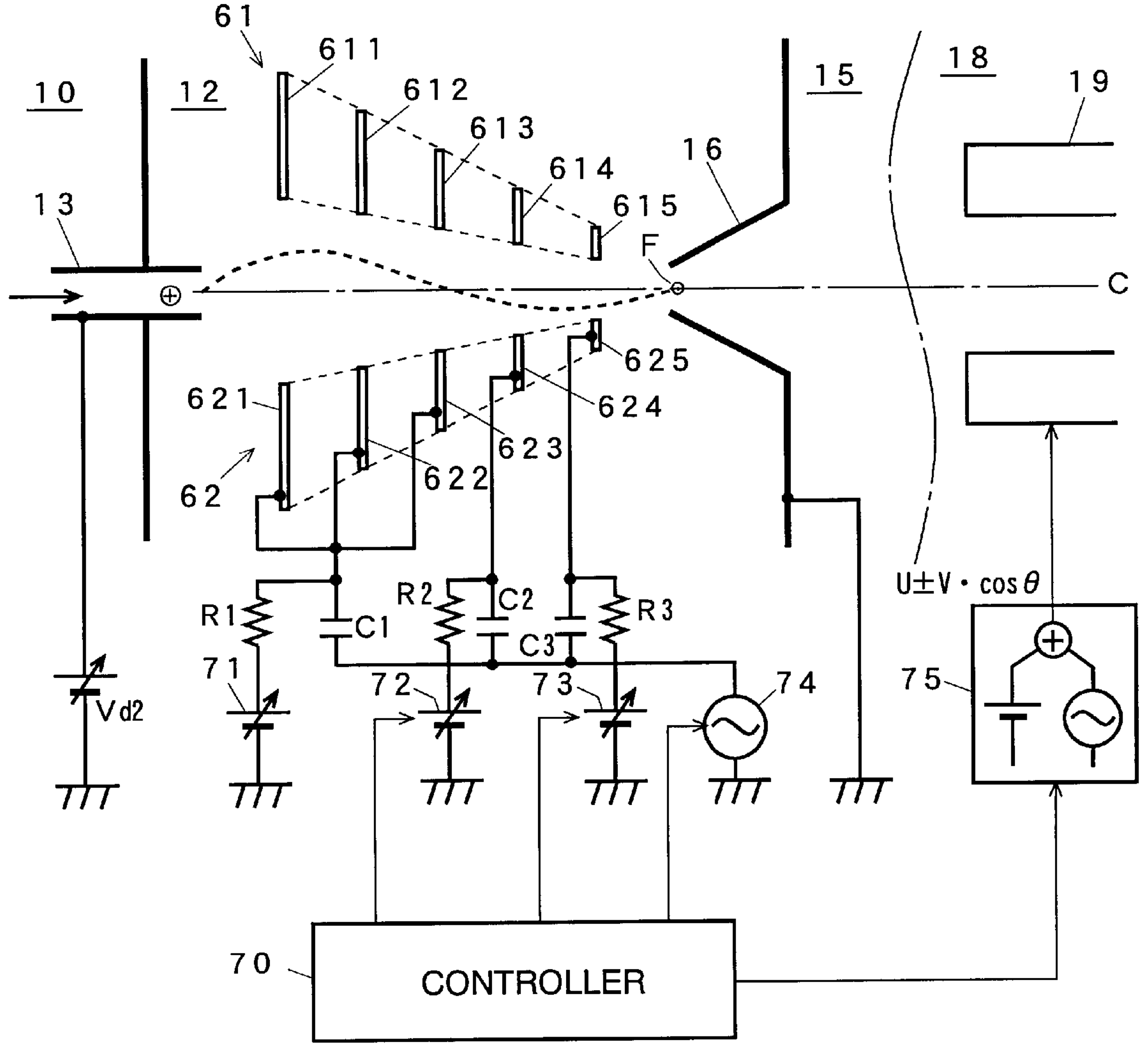
FIG. 5 shows the construction of an ion lens and peripheral parts in a mass spectrometer as a fourth embodiment of the present invention.

Referring to FIGS. 5 and 6, the mass spectrometer of the fourth embodiment includes an ion lens 60 identical to the ion lens 40 of the second embodiment; i.e., the diameters of incircles of the lens electrodes (611–615, 621–625) become smaller toward the exit of the ion lens 60 and the space surrounded by the virtual rod electrodes are conical. The mass spectrometer of the present embodiment is featured by a voltage unit for applying voltage to the lens electrodes (611–615, 621–625).

That is, the voltage unit includes three DC voltage sources 71–73, a high frequency AC voltage source 74, resistors R1–R3, capacitors C1–C3 and a controller 70. In the five lens electrodes 621–625: first three lens electrodes 621–623 are applied a DC voltage from the DC voltage source 71 and a high frequency AC voltage from the high frequency AC voltage source 74; fourth lens electrode 624 is applied another DC voltage from the DC voltage source 72 and the same high frequency AC voltage from the high frequency AC voltage source 74; and the last lens electrode 625 is applied still another DC voltage from the DC voltage source 73 and the same high frequency AC voltage from the high frequency AC voltage source 74.

The lens electrodes 611–615 of the opposing virtual rod electrode are applied the same voltage as above, and the lens electrodes of the other pair of virtual rod electrodes (not shown in FIG. 5) are applied similar voltages but with the high frequency AC voltage of a reversed phase. The controller 70 controls the second DC voltage source 72, the third DC voltage source 73 and the high frequency AC voltage 74. Also, the controller 70 controls another voltage unit 75 for applying voltage to the quadrupole filter 19 in the analyzing chamber 19.

Figure 6A:
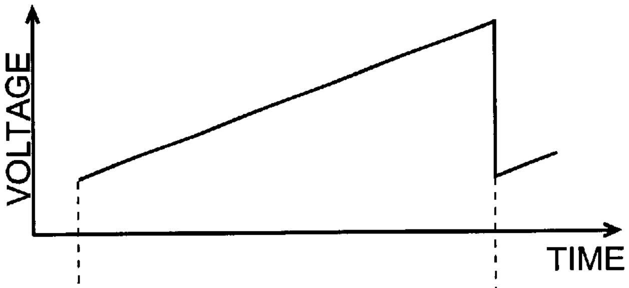
FIGS. 6A–6D are waveform diagrams showing the operation of the mass spectrometer of the fourth embodiment.
Figure 6B:
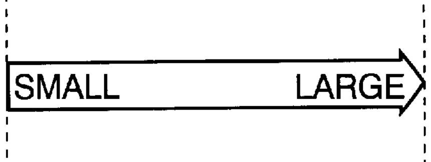

The operation of the mass spectrometer of the fourth embodiment is as follows. When the mass spectrometry is performed by a mass-scanning method, the controller 70 controls the voltage unit 75 so that the voltage applied to the quadrupole filter 19 changes as shown in FIG. 6A, where the voltage increases linearly (or incrementally) in each cycle. When ions are introduced into the space within the quadrupole filter 19 along its longitudinal axis, those ions having a particular mass number are selectively detected by the ion detector (not shown in FIG. 5) at each time point. For example, at the start of each cycle, only those ions having the smallest mass number are allowed to pass through the quadrupole filter 19. Then, the mass number of the ions passing through the quadrupole filter 19 increases according to the increase in the voltage (FIG. 6B).

Figure 6C:
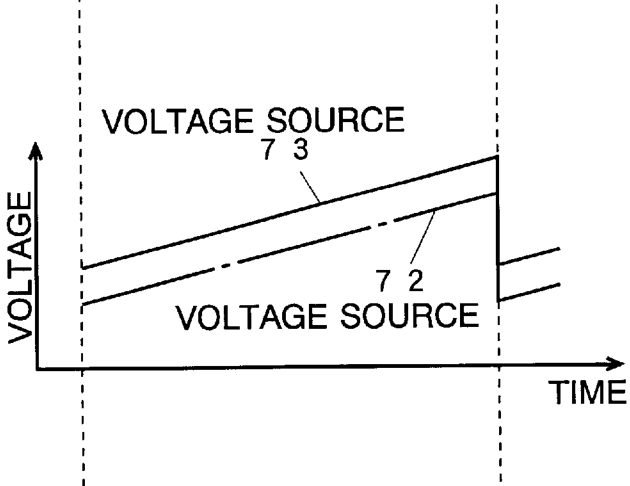
Figure 6D:
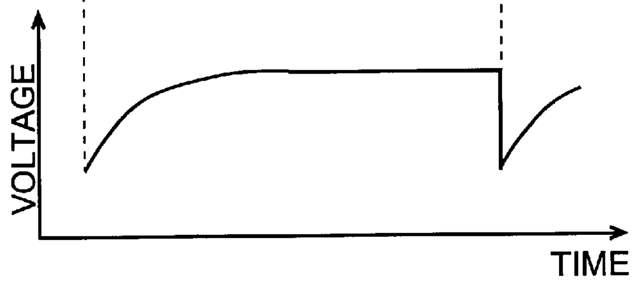

Synchronous to changing the voltage applied to the quadrupole filter 19, the controller 19 controls the DC voltage sources 72, 73 and the high frequency AC voltage source 74 so that the voltages generated by these voltage sources change as shown in FIGS. 6C and 6D. In detail, the DC voltages generated by the DC voltage sources 72, 73 are increased according to the increase in the mass number of ions intended to pass through the quadrupole filter 19. When, for example, a positive ion enters the ion lens 60, the increase in the DC voltage as shown in FIG. 6C causes a deceleration of the ion, and the decelerating effect is greater as the mass number of the ion is larger. Thus, the ions having a great amount of kinetic energy and travelling at a relatively high speed are decelerated greatly in the latter half of the ion lens 60. As a result, the ions become more liable to be influenced by the electric field, and come to converge on the focal point F of the ion lens 60. Thus, in the mass spectrometer of the fourth embodiment, the difference in the probability of an ion's passing through the ion lens with respect to the mass number of the ions intended to pass through the ion lens is eliminated.

The voltage control method of the fourth embodiment is also applicable to the mass spectrometer as shown in FIG. 1. It should be noted, however, that a larger ion controlling effect is obtained with the lens electrode arrangement of a smaller incircle. Therefore, it is preferable to use an ion lens constructed as shown in FIG. 3A or 5 and control the DC voltage applied to the lens electrodes with smaller incircles (or closer to the ion beam axis C).

It should be noted that the above-described embodiments are mere example and may be modified in various forms within the spirit and scope of the present invention.

What is claimed is:

1. A mass spectrometer including an ion lens for converging ions, wherein the ion lens comprises an even number of virtual rod electrodes positioned separately around an ion beam axis, where each of the virtual rod electrodes comprises a plurality of separate plural metallic plate electrodes aligned in a row, a voltage is applied to each of the plate electrodes, and a space defined by an envelope of incircles of the virtual rod electrodes is shaped conical with a narrower end at an exit of the ion lens.

2. The mass spectrometer according to claim 1, wherein the voltage is composed of a DC voltage and a high frequency AC voltage superimposed thereon, and the DC voltage is changed according to the position of the plate electrode while the high frequency AC voltage is the same irrespective of the position.

3. The mass spectrometer according to claim 1, wherein the ion lens is accommodated in a chamber having an ion introduction opening and an ion exit opening offset from an axis of the ion introduction opening and the plate electrodes are aligned obliquely from the ion introduction opening to the ion exit opening.

4. The mass spectrometer according to claim 2, wherein the ion lens is accommodated in a chamber having an ion introduction opening and an ion exit opening offset from an axis of the ion introduction opening, and the plate electrodes are aligned obliquely from the ion introduction opening to the ion exit opening.

5. The mass spectrometer according to claim 1, wherein the voltage applied to at least one of the plate electrodes is changed according to a mass number of ions intended to pass through the ion lens so that a difference in a probability of an ion's passing through the ion lens with respect to the mass number of the ions intended to pass through the ion lens is eliminated.

6. The mass spectrometer according to claim 5, wherein the voltage is composed of a DC voltage and a high frequency AC voltage superimposed thereon, and the DC voltage applied to at least one of the plate electrodes is changed according to the mass number of ions intended to pass through the ion lens.

7. The mass spectrometer according to claim 5, wherein only the DC voltage or voltages applied to a part of the lens electrodes nearest to the exit of the ion lens are changed according to the mass number of ions intended to pass through the ion lens.

8. The mass spectrometer according to claim 6, wherein only the DC voltage or voltages applied to a part of the lens electrodes nearest to the exit of the ion lens are changed according to the mass number of ions intended to pass through the ion lens.

9. The mass spectrometer according to claim 3, wherein the voltage is not the same for all of the plate electrodes in at least one of the virtual rod electrodes.

10. The mass spectrometer according to claim 4, wherein the voltage is not the same for all of the plate electrodes in at least one of the virtual rod electrodes.

* * * * *